United States Patent
Ahn et al.

[11] Patent Number: 6,005,826
[45] Date of Patent: Dec. 21, 1999

[54] ADDRESS SIGNAL TRANSITION DETECTING CIRCUIT FOR SEMICONDUCTOR MEMORY DEVICE

[75] Inventors: Jin-Hong Ahn, Anyang; Oh-Sang Yoon, Seoul, both of Rep. of Korea

[73] Assignee: LG Semicon Co., Ltd., Cheongju, Rep. of Korea

[21] Appl. No.: 09/054,469

[22] Filed: Apr. 3, 1998

[30] Foreign Application Priority Data

Jun. 11, 1997 [KR] Rep. of Korea ............... 24018

[51] Int. Cl.⁶ .................................. G11C 7/00
[52] U.S. Cl. ................ 365/233.5; 365/203; 365/205; 365/189.08
[58] Field of Search .................. 365/233.5, 203, 365/205, 189.08

[56] References Cited

U.S. PATENT DOCUMENTS

| | | | |
|---|---|---|---|
| 4,891,792 | 1/1990 | Hanamura et al. | 365/189.05 |
| 4,894,803 | 1/1990 | Aizaki | 365/189.05 |
| 5,264,737 | 11/1993 | Abe | 365/265 |
| 5,313,434 | 5/1994 | Abe | 365/233.5 |
| 5,335,207 | 8/1994 | Takamoto | 365/233.5 |
| 5,694,369 | 12/1997 | Abe | 365/210 |

*Primary Examiner*—David Nelms
*Assistant Examiner*—Hoai V. Ho
*Attorney, Agent, or Firm*—Fleshner & Kim

[57] ABSTRACT

An address signal transition detecting apparatus includes an address transition detecting circuit for detecting transitions in address signals, accordingly generating address transition detection signals and summing the address transition detection signals to generate an address transition detection sum signal ATDSUM, respectively outputting a first pulse signal YE for activating a column address decoder, a second pulse signal P for activating a precharger and a third pulse signal SE for activating a sense amplifier in accordance with an address transition detecting sum signal ATDSUM, and once again outputting another first pulse signal YE for activating the column address decoder in response to a fourth pulse signal YE2 generated in accordance with the address transition detection sum signal ATDSUM and the first pulse signal YE. The apparatus enables accurately reading a data signal on a data line by twice generating the first pulse signal YE that serves to activate the column address decoder, whereby the sense amplifier is able to sense a data signal in an improved manner.

19 Claims, 6 Drawing Sheets

ADDRESS SIGNAL TRANSITION DETECTING CIRCUIT FOR SEMICONDUCTOR MEMORY DEVICE

BACKGROUND OF THE INVENTION

1. Field of the Invention

The present invention relates to an address transition detecting circuit for a semiconductor memory device, and more particularly to an improved address transition detecting circuit for a semiconductor memory device including a pulse generation circuit provided with a cross-coupled logic gate and a delay unit, capable of doubly generating a pulse signal which serves to activate a column address decoder circuit in accordance with an address transition detection signal.

2. Description of the Prior Art

As shown in FIG. 1, a conventional semiconductor memory device is provided with: an address transition detecting circuit 1 receiving a plurality of address signals A0~An outputted from an address buffer (not shown), detecting an address transition and accordingly outputting a second pulse signal (precharge signal) P, a first pulse signal (column address decoder enable signal) YE, and a third pulse signal (sense amplifier enable signal) SE using the combined signal; a column address decoder circuit 2 activated in accordance with the first pulse signal YE outputted from the address transition detecting circuit 1, decoding the address signals A0~An outputted from the address buffer (not shown), and outputting a plurality of control signals (column switching signals) S0~Sn, for selecting among a plurality of bit line pairs (BL0,/BL0)~(BLn,/BLn); a column switch circuit 3 outputting data from a selected column of a memory cell array (not shown) in accordance with the bit line pairs (BL0,/BL0)~(BLn,/BLn) selected by the control signals S0~Sn outputted from the column address decoder circuit 2; a precharger circuit 4 activated in accordance with the second pulse signal P outputted from the address transition detecting circuit 1, and supplying a charge to the data line pair DL,/DL connected to the column switch circuit 3; a sense amplifier circuit 5 activated in accordance with the third pulse signal SE outputted from the address transition detecting circuit 1, and sensing and amplifying a data signal applied thereto via the precharger circuit 4; and a data latch/output buffer circuit 6 for latching a data signal amplified in the sense amplifier 5 and generating an output signal DOUT.

With reference to FIG. 2, the address transition detecting circuit 1 includes: an address transition detecting sub-circuit 11 detecting transitions in address signals A0~An outputted from the external address buffer (not shown) to generate an address transition detection signal; an address transition detection summing circuit 12 summing the address transition detection signals outputted from the address transition sub-circuit 11; and a column controller 13 receiving an address transition detection sum signal ATDSUM outputted from the address transition detecting summing circuit 12, and outputting the first pulse signal YE for activating the column address decoder circuit 2 and the third pulse signal SE for activating the sense amplifier circuit 5.

The operation of the thusly constituted conventional memory device will now be described with reference to FIGS. 1 and 2.

When the address signals A0~An outputted from the address buffer (not shown) are transitted, the respective address transition detecting sub-circuit 11 of the address transition detecting circuit 1 and respectively generate address transition detection signals. The address transition detection summing circuit 12 serves to sum the address transition detection signals outputted from the address transition detection sub-circuit 11 for thereby outputting the summed signal ATDSUM.

The column controller 13 receives the address transition detection sum signal ATDSUM outputted from the address transition detection summing circuit 12, and outputs the first pulse signal YE for driving the column address decoder circuit 2, the second pulse signal P for driving the precharger circuit 4 and the third pulse signal SE for driving the sense amplifier circuit 5.

The column address decoder circuit 2 activated by the first pulse signal YE outputted from the column controller 13 decodes the address signals A0~An outputted from the address buffer (not shown) and outputs the control signals S0~Sn, and the column switch circuit 3 outputs data from a selected column of a memory cell array (not shown) to the data line pair DL,/DL in accordance with the bit line pairs (BL0,/BL0)~(BLn,/BLn) selected by the control signals S0~Sn.

The precharger circuit 4 activated by the second pulse signal P outputted from the column controller 13 supplies electrical charge to the data line pair DL,/DL.

Then, when the second pulse signal P outputted from the column controller 13 is transitted, the precharger circuit 4 becomes non-active. The sense amplifier circuit 5 is activated by the third pulse signal SE outputted from the column controller 13 for thereby sensing and amplifying the data value applied thereto from the data line pair DL,/DL via the precharger circuit 4, and the data amplified in the sense amplifier circuit 5 is externally outputted via the data latch/output buffer circuit 6.

However, as shown in FIG. 3A, in the thusly constituted conventional memory device, the address signals A0~An may quickly change their logic values when there occurs noise or a short pulse in the address signals A0~An applied from an external system to the address transition detecting sub-circuit 11.

Consequently, the address transition detection sum signal ATDSUM outputted from the address transition detection summing circuit 12 becomes irregular as shown in FIG. 3B. The first pulse signal YE outputted from the column controller 13 also becomes unstable as shown in FIG. 3C, in accordance with the irregular address transition detection sum signal ATDSUM outputted from the address transition detection summing circuit 12. Further, the control signals S0~Sn outputted from the column address decoder circuit 2 activated by the first pulse signal YE respectively become unstable.

As shown in FIG. 3D, the voltage difference in data signals outputted in accordance with the unstable control signals S0~Sn from a memory cell array via the data line pair DL,/DL becomes insufficient for the sense amplifier circuit 5 to sense, so that the memory device may carry out an erroneous operation during a data read-out operation.

SUMMARY OF THE INVENTION

Accordingly, it is an object of the present invention to provide an address transition detecting circuit for a semiconductor memory device for enabling accurate transferring of a data signal to a data line by generating once again a pulse signal that serves to activate a column address decoder circuit by using an incorporated pulse generation circuit, so that a sense amplifier circuit can well carry out a data sensing.

To achieve the above-described object, there is provided an address signal transition detecting apparatus according to the present invention which includes an address transition detecting circuit for detecting transitions in address signals to generate address transition detection signals and summing the same to generate an address transition detection signal ATDSUM, respectively outputting a first pulse signal YE for activating a column address decoder, a second pulse signal P for activating a precharger and a third pulse signal SE for activating a sense amplifier 5 in accordance with the address transition detection sum signal ATDSUM, and once again outputting the first pulse signal YE for activating the column address decoder in response to a fourth pulse signal YE2 generated in accordance with the address transition detection sum signal ATDSUM and the previously outputted first pulse signal YE.

BRIEF DESCRIPTION OF THE DRAWINGS

The present invention will become more clearly understood with reference to the accompanying drawings which are given only by way of illustration and thus are not limitative of the present invention, wherein.

DETAILED DESCRIPTION OF THE INVENTION

Figure 1:
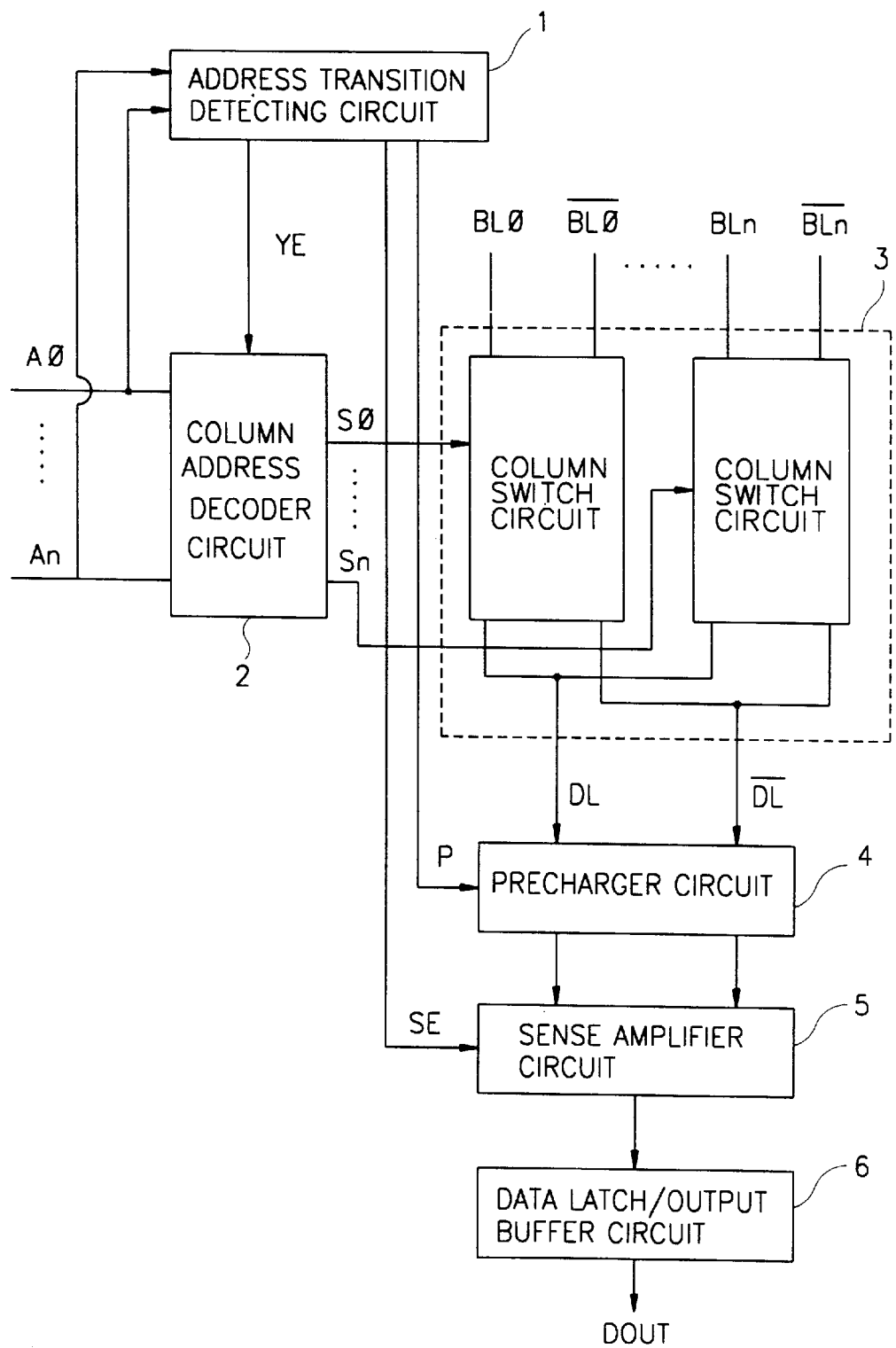
FIG. 1 is a block circuit diagram of a portion conventional semiconductor memory device.
Figure 2:
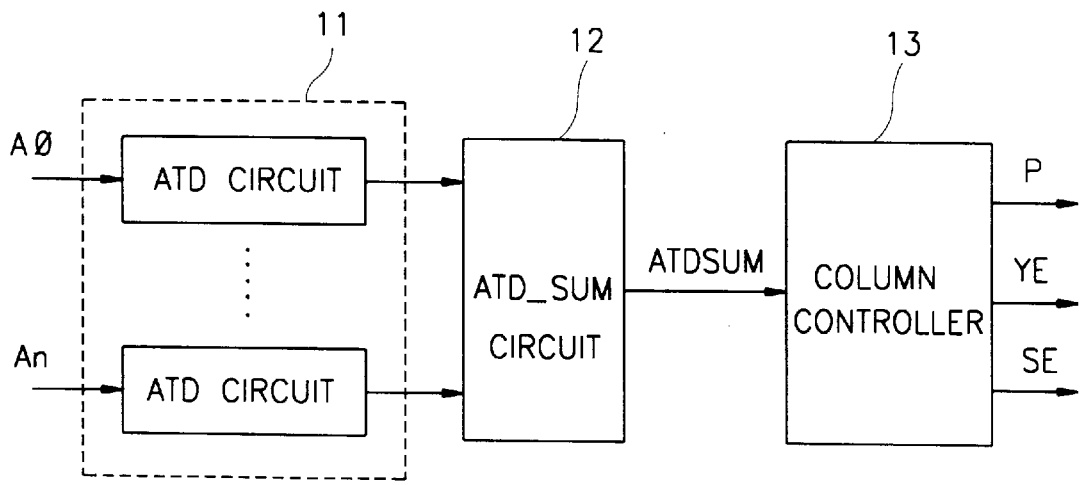
FIG. 2 is a block circuit diagram detailing an address transition detecting circuit in the circuit of FIG. 1.
Figure 3A:
FIGS. 3A through 3D are timing diagrams of respective signals illustrating the operation of the circuit of FIG. 1.
Figure 3B:
Figure 3C:
Figure 3D:

With reference to the accompanying drawings, an address transition detecting circuit according to the present invention will now be described. Here, with regard to portions identical to those of the conventional art, identical reference numerals will be employed in the accompanying drawings.

Figure 4:
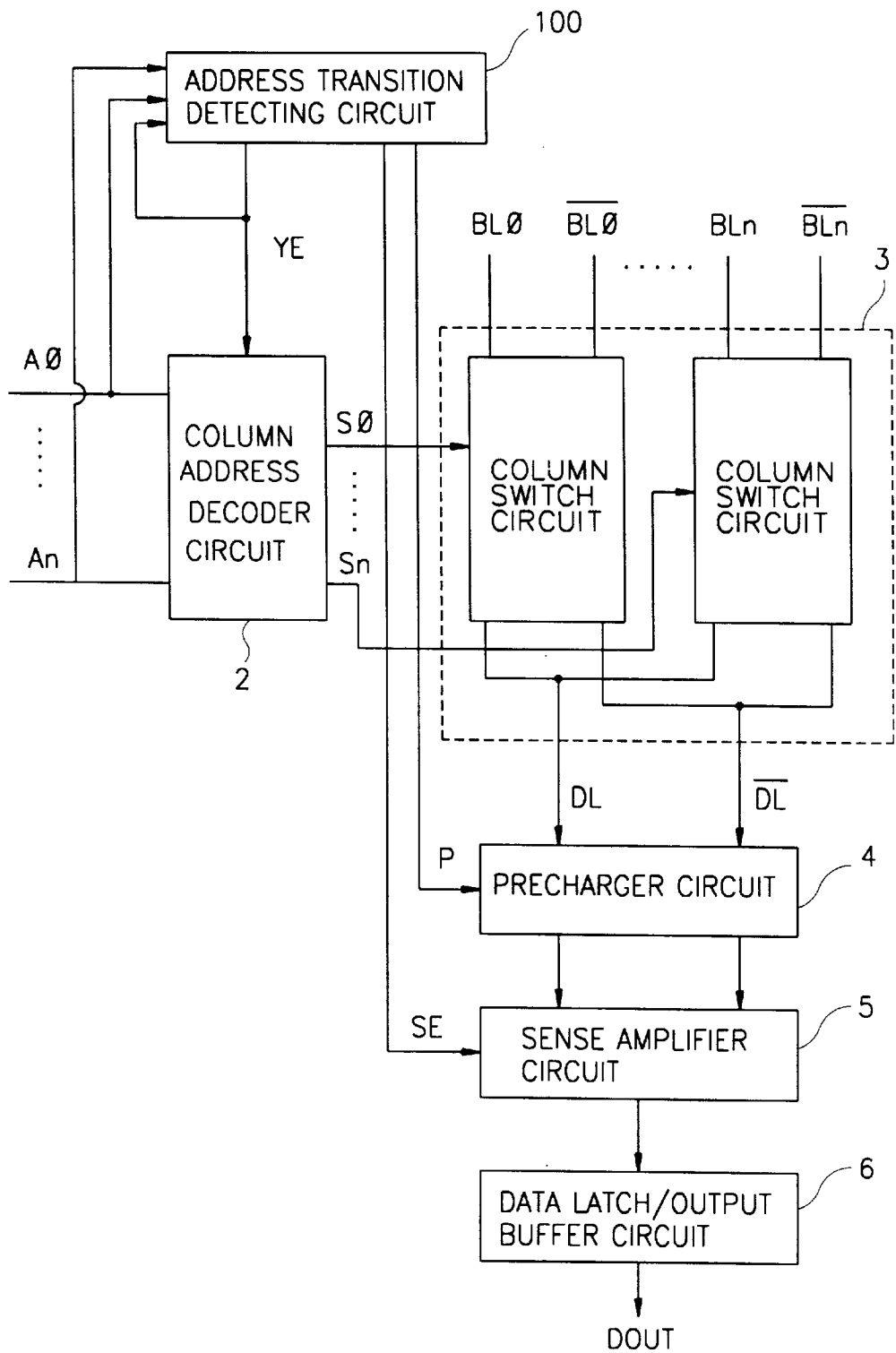
FIG. 4 is a block circuit diagram of a portion of a semiconductor memory device implementing an address transition detecting circuit according to the present invention.

As shown in FIG. 4, the semiconductor memory device to which is applied the address transition detecting circuit according to the present invention is provided with a column address decoder unit 2 outputting a plurality of control signals S0~Sn in accordance with a plurality of address signals A0~An respectively applied thereto from an external address buffer (not shown), a column switch circuit 3 outputting memory cell array data values in accordance with the plurality of control signals S0~Sn respectively outputted from the column address decoder circuit 2, a precharger 4 for supplying an electrical charge to data lines DL,/DL connected with the column switch circuit 3, a sense amplifier 5 sensing and amplifying data signals outputted via the precharger circuit 4 over data lines DL,/DL, and a data latch/output buffer circuit 6 externally outputting data signals sensed and amplified in the sense amplifier circuit 5. The semiconductor memory device further includes an address transition detecting circuit 100 detecting transitions in address signals A0~An from an external address buffer (not shown) and accordingly generating address transition detection signals summing these address transition detection signals to generate an address transition detection sum signal ATDSUM, and in accordance with the address transition detection sum signal ATDSUM outputting a first pulse signal YE for activating the column address decoder circuit 2, a second pulse signal P for activating the precharger circuit 4 and a third pulse signal SE for activating the sense amplifier 5, and then, in response to a fourth pulse signal YE2 generated in accordance with the address sum signal ATDSUM and the first pulse signal YE once more outputting the first pulse signal YE to activate the column address decoder circuit 2.

Figure 5:
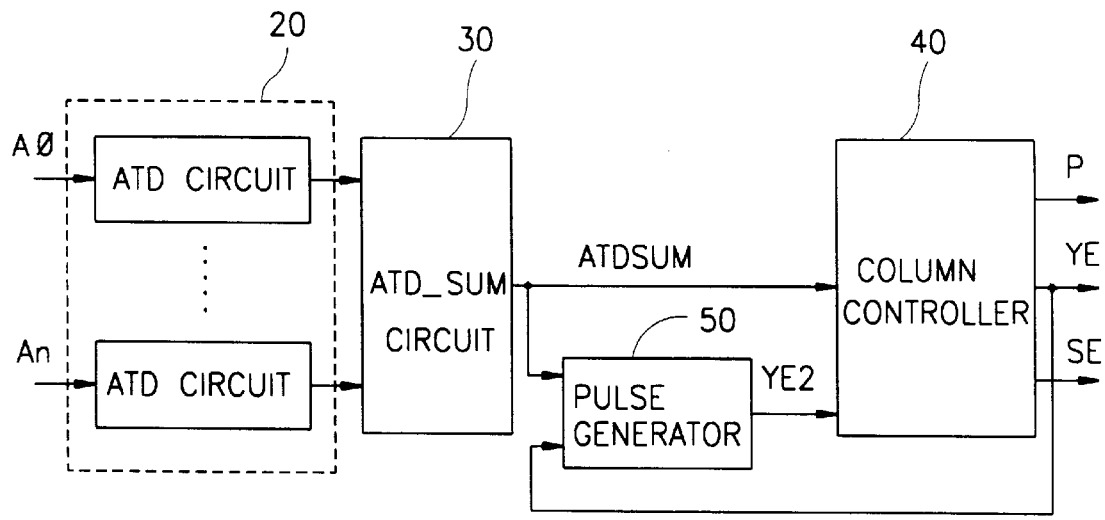
FIG. 5 is block circuit diagram illustrating the composition of an address transition detecting circuit in the circuit of FIG. 5 according to a first embodiment of the present invention.

With reference to FIG. 5, the address transition detecting circuit 100 according to a first embodiment of the present invention includes: an address transition detecting sub-circuit 20 detecting respective transitions in the address signals A0~An outputted from the external address buffer (not shown) and accordingly generating a corresponding plurality of address transition detection signals; an address transition summing circuit 30 summing the address transition detection signals outputted from the address transition detecting sub-circuit 20; a column controller 40 generating the first pulse signal YE for activating the column address decoder circuit 2, the second pulse signal P for activating the precharger circuit 4 and the third pulse signal SE for activating the sense amplifier circuit 5; and a pulse generator 50 generating the fourth pulse signal YE2 in response to the first pulse signal YE outputted from the column controller 40 and the address transition detection sum signal ATDSUM outputted from the address transition detection summing circuit 30. Here, the fourth pulse signal YE2 is outputted to the column controller 40, which in turn outputs once again the first pulse signal YE which serves to activate the column address decoder circuit 2 in accordance with the fourth pulse signal YE2 outputted from the pulse generator 50.

Figure 6:
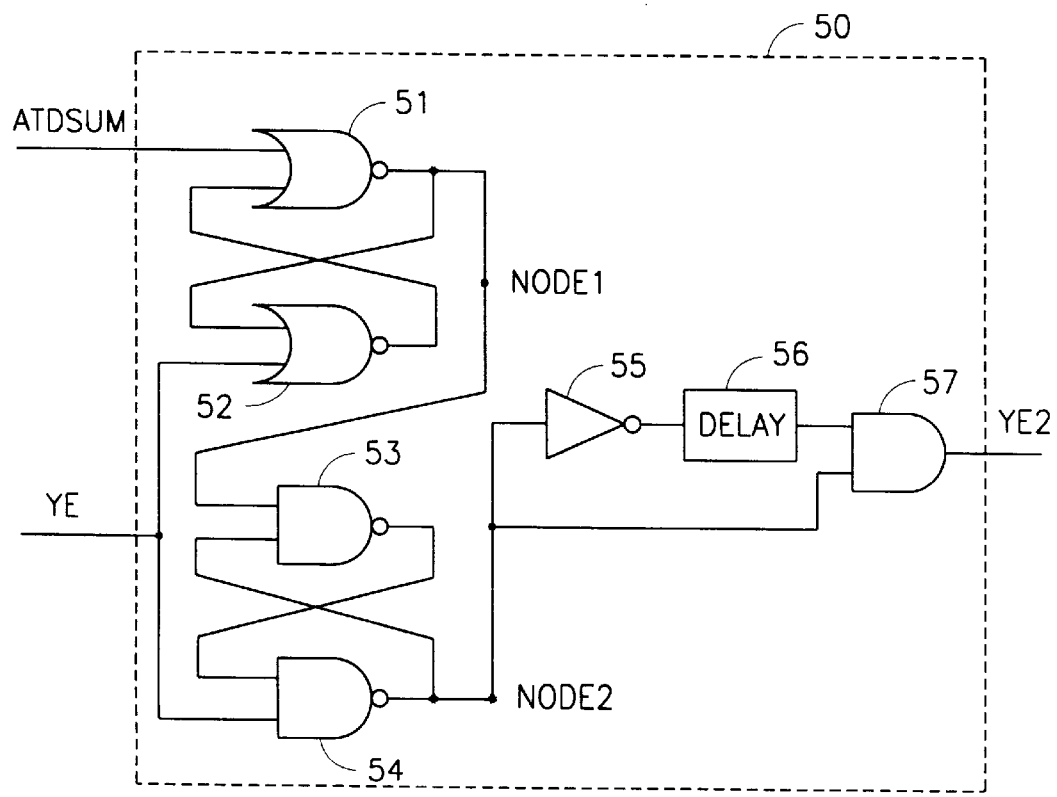
FIG. 6 is a schematic circuit diagram illustrating the composition of a pulse generator in the circuit of FIG. 5.

Referring to FIG. 6, the pulse generator 50 includes: a first NOR gate 51 and a second NOR gate 52, wherein an output terminal of the NOR gate 51 is connected to an input terminal of the NOR gate 52 and vise versa, the address transition detection sum signal ATDSUM outputted from the address transition detecting circuit 30 is applied to another input terminal of the NOR gate 51, and the first pulse signal YE outputted from the column controller 40 is applied to another input terminal of the NOR gate 52, for thereby carrying out a NORing operation; a first NAND gate 53 and a second NAND gate 54, wherein an output terminal of the NAND gate 53 is connected to an input terminal of the NAND gate 54 and vise versa, an output signal of the first NOR gate 51 is applied to another input terminal of the NAND gate 53, and the first pulse signal YE outputted from the column controller 40 is applied to another input terminal of the NAND gate 54, for thereby carrying out a NANDing operation; an inverter 55 for inverting an output signal of the second NAND gate 54; a delay unit 56 for delaying an output signal of the inverter 55; and an AND gate 57 for ANDing respective output signals of the delay unit 56 and the second NAND gate 54, for thereby outputting the fourth pulse signal YE2.

The operation of the thusly constituted memory device implementing the address transition detecting circuit according to the first embodiment of the present invention will now be described.

First, as shown in FIG. 5, when the address signals A0~An from an external address buffer (not shown) are transitted, the address transition detecting sub-circuit 20 detects the transitions in the address signals A0~An and generates corresponding address transition detection signals which detection signals are outputted to the address transition detection summing circuit 30.

The address transition detection summing circuit 30 sums the address transition detection signals and outputs the summed signal ATDSUM to the column controller 40. The column controller 40 outputs the first pulse signal YE for activating the column address decoder circuit 2, the second pulse signal P for activating the precharger circuit 4, and the third pulse signal SE for activating the sense amplifier circuit 5, respectively in accordance with the address transition detection sum signal ATDSUM outputted from the address transition detection summing circuit 30.

The pulse generator 50 receives the first pulse signal YE outputted from the column controller 40 and the address transition detection sum signal ATDSUM outputted from the address transition detection summing circuit 30, and outputs to the column controller 40 the fourth pulse signal YE2 in accordance with these received signals. The column controller 40 once again outputs the first pulse signal YE which serves to activate the column address decoder circuit 2.

The additional outputting of the first pulse signal YE by the column controller 40 will now be further described.

Figure 7A:
FIGS. 7A through 7G are timing diagrams of respective signals illustrating the operation of the circuit of FIG. 4.
Figure 7B:

As shown in FIG. 7A, when noise occurs in the address signal A0, the address signal A0 quickly changes its logic value, and the corresponding output signal of the address transition detecting circuit 20 in the sub-circuit which receives the address signal A0 containing noise is also quickly transitted. Therefore, as shown in FIG. 7B, the address transition sum signal ATDSUM outputted from the address transition detection summing circuit 30 becomes irregular in accordance with the output signal of the address transition detecting circuit 20.

Figure 7C:
Figure 7D:
Figure 7E:

At this time, when the address transition detection sum signal ATDSUM outputted from the address transition detection summing circuit 30 is transitted as shown in FIG. 7C, a node 1 in the pulse generator 50 as shown in FIG. 6 is turned to a low level. As shown at time point (1) in FIG. 7F, when the first pulse signal YE becomes a high level, the node 1 is again turned to a high level, and a node 2 in FIG. 6 is turned to a low level. When the first pulse signal YE is turned from a high level to a low level, the node 2 is turned from a low level to a high level, whereupon the pulse generator 50 outputs the fourth pulse signal YE2 as shown in FIG. 7E.

In accordance with the fourth pulse signal YE2 outputted from the pulse generator 50, the column controller 40 in FIG. 5 once again outputs the first pulse signal YE which serves to activate the column address decoder circuit 2. Here, the secondly generated first pulse signal YE has an extended pulse width due to the delay unit 56 in the pulse generator 50.

The column address decoder circuit 2 in FIG. 4 is driven by the first pulse signal YE firstly outputted from the column controller 40, and decodes the address signals A0~An from the external address buffer (not shown), for thereby outputting the control signals S0~Sn.

The column switch circuit 3 outputs to the data line pair DL,/DL a data signal stored in a memory cell array (not shown) in accordance with a signal outputted via a selected one of the bit line pairs (BL0,/BL0)~(BLn,/BLn) selected by the control signals S0~Sn outputted from the column address decoder circuit 2. The precharger circuit 40 is activated by the second pulse signal P and supplies electrical charge to the data lines DL,/DL connected thereto from the column switch circuit 3.

When the second pulse signal P outputted from the column controller 40 is transitted, the precharger circuit 4 becomes non-active, and the sense amplifier circuit 5 activated by the third pulse signal SE outputted from the column controller 40 senses and amplifies the voltage difference between data signals applied thereto through the data lines DL,/DL.

Figure 7F:
Figure 7G:

At this time, the column address decoder circuit 2, the column switch circuit 3 and the precharger circuit 4 respectively repeat their previous operations in accordance with the first pulse signal YE which is once again outputted from the column controller 40 as shown at (2) in FIG. 7F. That is, the column switch circuit 3 once again outputs a normal data signal having a larger voltage difference than between the data signals at (1) in FIG. 7G which was deficient to be sensed by the sense amplifier circuit 5 due to the noise in the address signal.

The sense amplifier circuit 5 senses and amplifies the data signal, and the data latch/output buffer 6 latches the data signal amplified in the sense amplifier circuit 5 and the latched signal is externally outputted.

When an address signal carries noise, the address transition detection signals are quickly switched so that although a voltage difference occurring on the data line pair DL,/DL due to an incomplete first pulse signal YE is small, the internally provided pulse generator 50 causes the address transition detecting circuit 10 to once again generate the first pulse signal YE, causing the data signal from the memory cell array to be once again outputted, for thereby accurately transferring the data signal to the data line pair DL,/DL.

Figure 8:
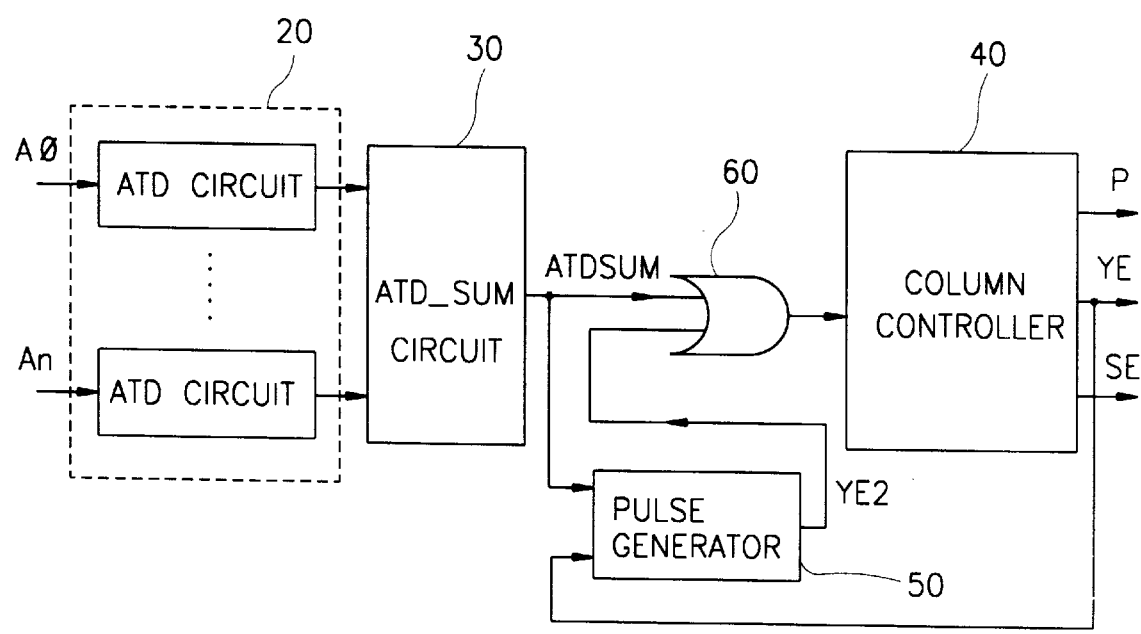
FIG. 8 is a block circuit diagram illustrating the composition of an address transition detecting circuit in the circuit of FIG. 5 according to a second embodiment of the present invention.

With reference to the second embodiment of the present invention as shown in FIG. 8, the address transition detecting circuit 100 in FIG. 4 is provided with: an address transition detecting sub-circuit 20 detecting transitions in the address signals A0~An from the external address buffer (not shown) and generating a corresponding plurality of address transition detection signals; an address transition detection summing circuit 30 summing the address transition detection signals outputted from the address transition detecting sub-circuit 20 and generating am address transition detection sum signal ATDSUM; a column controller 40 for generating a first pulse signal YE for activating the column address decoder circuit 2, a second pulse P activating the precharger circuit 4 and a third pulse signal SE for activating the sense amplifier circuit 5, in response to an externally generated signal; a pulse generator 50 generating a fourth pulse signal YE2 in response to the first pulse signal YE outputted from the column controller 40 and the address sum address ATDSUM outputted from the address transition detection summing circuit 30; and an OR gate 60 ORing the fourth pulse signal YE2 outputted from the pulse generator 50 and the address transition detection sum signal ATDSUM outputted from the address transition detection summing circuit 30, thereby outputting the ORed signal to the column controller 40.

Description of the operation of the thusly constituted address transition detecting circuit according to the second embodiment of the present invention will be omitted as it will be easily understandable by those of ordinary skill in the art given its similarity to the first embodiment described previously.

In the memory device adopting the address transition detecting circuit according to the second embodiment of the present invention, if the address transition detecting circuit 100 generates an incomplete first pulse signal YE due to noise in an externally applied address signal, although the sense amplifier 5 is unable to sense a small voltage difference between signals carried on the data line pair DL,/DL, the address transition detecting circuit 100 once again generates the first pulse signal YE due to the internally embodied pulse generator 50, so that the data signal is accurately transferred to the data line pair DL,/DL by outputting once again the data signal stored in the memory cell array.

As described above, when there occurs noise in an externally applied address signal whereby the address transition detection signals are quickly switched so that an incomplete first pulse signal YE is outputted from the address transition detecting circuit 100, this pulse signal YE in combination with the ATD signal drives the address transition detecting circuit 100 to once again output the first pulse signal YE by operation of the incorporated pulse generator 50, so that the data signals are accurately transmitted via the data line pair DL,/DL for thus enabling the sense amplifier 5 to well sense the data signal outputted via the precharger circuit 4. As a result, when the memory device adopting the ATD circuit according to the present invention carries out a read-out operation, an erroneous operation which may result from the address signal noise is prevented from occurring.

What is claimed is:

1. An address transition detecting apparatus for a semiconductor memory device, comprising:

address transition detecting circuit that detects transitions in a plurality of address signals to generate an address transition detection sum signal, and outputs a first column decoder activating pulse signal for transmission to a column address decoder circuit, a precharger activating pulse signal and a sense amplifier activating pulse signal based on the address detection sum signal, and wherein responsive to the first column decoder activating pulse signal and the address transition detection sum signal outputs an additional column decoder activating pulse signal for transmission to the column address decoder circuit.

2. The apparatus of claim 1, wherein the address transition detecting circuit comprises:

a plurality of address transition detectors each detects transitions in a corresponding one of the plurality of address signals, generates and outputs a corresponding address transition detection signal of a plurality of address transition detection signals;

an address transition detection summing circuit that sums the address transition detection signals generated by the plurality of address transition detectors to generate the address transition detection sum signal;

a column controller that receives the address transition detection sum signal generated by the address transition detection signal summing circuits generates and outputs the first column decoder activating pulse signal, the precharger activating pulse signal and the sense amplifier activating pulse signal and;

a pulse generator that outputs a column control signal responsive to the address transition detection sum signal and the first column decoder activating pulse signal outputted by the column controller, wherein the column controller outputs the additional column decoder activating pulse signal based on the address transition detection sum signal and the column control signal.

3. The apparatus of claim 2, wherein the pulse generator comprises:

a NOR circuit that NORs the address transition detection sum signal and the first column decoder activating pulse signal outputted from the column controller;

a NAND circuit that NANDs an output signal of the NOR circuit and the first column decoder activating pulse signal; and a logic circuit that logically processes an output signal of the NAND circuit to output the column control signal.

4. The apparatus of claim 3, wherein the NOR circuit comprises:

a first NOR gate that receives the address transition detection sum signal at a first input terminal thereof; and a second NOR gate that receives an output signal of the first NOR gate, and that receives at a second input terminal thereof the first column decoder activating pulse signal, wherein an output terminal of the second NOR gate is connected to a second input terminal of the first NOR gate;

wherein the output signal of the NOR circuit is the output signal of the first NOR gate.

5. The apparatus of claim 3, wherein the NAND circuit comprises:

a first NAND gate that receives at a first input terminal thereof the output signal of the NOR circuit;

a second NAND gate that receives at a first input terminal thereof an output signal of the first NAND gate, and that receives at a second input terminal thereof the first column decoder activating pulse signal, wherein an output terminal of the second NAND gate is connected to a second input terminal of the first NAND gate;

wherein the output signal of the NAND circuit is outputted from the output terminal of the second NAND gate.

6. The apparatus of claim 3, wherein the first logic circuit comprises an inverter, a delay and a NAND gate.

7. The apparatus of claim 1, wherein the address transition detecting circuit comprises:

a plurality of address transition detectors each detects transitions in a corresponding one of the plurality of address signals, generates and outputs a corresponding address transition detection signal of a plurality of address transition detection signals;

an address transition detection summing circuit that sums the address transition detection signals generated by the plurality of address transition detectors to generate the address transition detection sum signal;

a column controller that in accordance with a first application of a combined signal thereto outputs the first column decoder activating pulse signal, the precharger activating pulse signal and the sense amplifier activating pulse signal, and in accordance with a subsequent application of the combined signal thereto outputs the additional column decoder activating pulse signal, an additional precharger activating pulse signal and an additional sense amplifier activating pulse signal;

a pulse generator that receives the address transition detection sum signal and the first column decoder activating pulse signal outputted by the column controller, wherein the column controller outputs the additional column decoder activating pulse signal based on the address transition detection sum signal and the column control signal; and a logic gate that logically processes the address transition detection sum signal and the column control signal to generate the first application and the subsequent application of the combined signal to the column controller.

8. The apparatus of claim 1, wherein the additional column decoder activating pulse signal is outputted in accordance with the address transition detection sum signal and the first column decoder activating pulse signal and has a longer duration than the first column decoder activating pulse signal.

9. The apparatus of claim 1, wherein data associated with a selected address transition detection sum signal are output based on a plurality of column switching signals responsive to the additional column decoder activating pulse signal.

10. An address transition detecting apparatus, comprising:

a plurality of address transition detectors each detects transitions in a corresponding one of the plurality of address signals, generates and outputs a corresponding address transition detection signal of a plurality of address transition detection signals;

an address transition detection summing circuit that sums the address transition detection signals to generate an address transition detection sum signal;

a column controller that receives the address transition detection sum signal and outputs a first column decoder signal to a decoder, a precharger activation signal and a sense amplifier activation signal; and a pulse generator that outputs a column controller signal responsive to the address transition detection sum signal and the first column decoder signal outputted by the column controller, wherein the column controller outputs a second column decoder signal for transmission to the decoder based on the address transition detection sum signal and the column control signal.

11. The apparatus of claim 10, wherein the pulse generator comprises:

a NOR circuit that NORs the address transition detection sum signal and the first column decoder signal outputted from the column controller;

a NAND circuit that NANDs an output signal of the NOR circuit and the first column decoder signal; and a logic circuit that logically processes an output signal of the NAND circuit to output the column control signal, wherein the decoder outputs a plurality of switching signals responsive to the first column decoder signal and the second column decoder signal.

12. The apparatus of claim 11, wherein the NOR circuit comprises:

a first NOR gate that receives the address transition detection sum signal at a first input terminal thereof; and a second NOR gate that receives an output signal of the first NOR gate, and that receives at a second input terminal thereof the first column decoder signal, wherein an output terminal of the second NOR gate is connected to a second input terminal of the first NOR gate;

wherein the output signal of the NOR circuit is the output signal of the first NOR gate.

13. The apparatus of claim 12, wherein the NAND circuit comprises:

a first NAND gate that receives at a first input terminal thereof the output signal of the NOR circuit;

a second NAND gate that receives at a first input terminal thereof an output signal of the first NAND gate, and that receives at a second input terminal thereof the first column decoder signal, wherein an output terminal of the second NAND gate is connected to a second input terminal of the first NAND gate;

wherein the output signal of the NAND circuit is outputted from the output terminal of the second NAND gate.

14. The apparatus of claim 12, wherein the first logic circuit comprises an inverter, a delay and a NAND gate.

15. The apparatus of claim 10, wherein data associated with a selected address transition detection sum signal are output based on a plurality of column switching signals responsive to the second column decoder signal.

16. An address transition detecting apparatus for a semiconductor memory device, comprising:

an address transition detecting circuit that detects transitions in a plurality of address signals to generate a corresponding address transition detection sum signal, wherein the address transition detecting circuit outputs first, second and third signals responsive to the address transition detection sum signal, wherein the address transition detecting circuit receives one of the first, second and third signals, and again outputs at least one of the first, second and third signals responsive to the corresponding address transition detection sum signal and the received one of the first, second and third signals.

17. The apparatus of claim 16, wherein the first, second and third signals are respectively a column decoder control signal for transmission to a column address decoder circuit, a precharger activating signal and a sense amplifier activating signal.

18. The address transition detecting apparatus of claim 16, wherein the address detection circuit comprises:

a plurality of address transition detectors that each detect transitions in a corresponding one of the plurality of address signals, generates and outputs a corresponding address transition detection signal of a plurality of address transition detection signals;

an address transition detection summing circuit that sums the address transition detection signals to generate the address transition detection sum signal;

a column controller that receives the address transition detection sum signal generated by the address transition detection signal summing circuit, generates and outputs the first, second and third signals; and a pulse generator that receives the address transition detection sum signal and the received one of the first, second and third signals to generate a fourth signal, wherein the column controller again outputs said one of the first, second and third signals responsive to the address transition detection sum signal and the fourth signal.

19. A semiconductor memory device, comprising:

a memory array including a plurality of memory cells in a matrix form of rows and columns;

an address decoder circuit connected to the memory array;

an address transition detecting circuit that detects transitions in a plurality of address signals to generate an address transition detection sum signal, and outputs a first column decoder activating pulse signal for transmission to an address decoder circuit, a precharger activating pulse signal and a sense amplifier activating pulse signal based on the address detection sum signal, and wherein responsive to the first column decoder activating pulse signal and the address transition detection sum signal outputs an additional column decoder activating pulse signal for transmission to the address decoder circuit, wherein the address decoder circuit receives the additional column decoder activating signal and outputs selection signals, and wherein the memory array outputs selected data responsive to the selection signals; and an input/output circuit connected to the memory array, wherein the input/output circuit receives the precharger activating pulse signal and the sense amplifier activating pulse signal and outputs the selected data from the memory array.

* * * * *